(12) United States Patent
Colpani

(10) Patent No.: US 8,338,888 B2
(45) Date of Patent: Dec. 25, 2012

(54) PROCESS FOR MANUFACTURING AN INTEGRATED DEVICE WITH "DAMASCENE" FIELD INSULATION, AND INTEGRATED DEVICE MADE BY SUCH PROCESS

(75) Inventor: Paolo Colpani, Agrate Brianza (IT)

(73) Assignee: STMicroelectronicis S.r.l., Agrate Brianza (MB) (IT)

( * ) Notice: Subject to any disclaimer, the term of this patent is extended or adjusted under 35 U.S.C. 154(b) by 0 days.

(21) Appl. No.: 12/893,219

(22) Filed: Sep. 29, 2010

(65) Prior Publication Data
US 2011/0073945 A1 Mar. 31, 2011

(30) Foreign Application Priority Data
Sep. 29, 2009 (IT) ................ TO2009A0738

(51) Int. Cl.
*H01L 29/66* (2006.01)
(52) U.S. Cl. ........ 257/342; 257/302; 257/329; 257/335; 257/341; 257/343
(58) Field of Classification Search .......... None
See application file for complete search history.

(56) References Cited

U.S. PATENT DOCUMENTS

| | | | |
|---|---|---|---|
| 4,746,625 A | 5/1988 | Morita et al. | |
| 5,681,776 A | 10/1997 | Hebert et al. | |
| 5,683,933 A | 11/1997 | Seino | |
| 5,834,360 A | 11/1998 | Tesauro et al. | |
| 6,339,001 B1 | 1/2002 | Bronner et al. | |
| 6,960,511 B2 | 11/2005 | Ito et al. | |
| 7,345,340 B2 | 3/2008 | Hitani et al. | |
| 2002/0158277 A1* | 10/2002 | Harada et al. | 257/288 |
| 2003/0153154 A1 | 8/2003 | Uehara et al. | |
| 2004/0145027 A1* | 7/2004 | Nitta et al. | 257/492 |
| 2004/0251492 A1 | 12/2004 | Lin | |
| 2005/0199951 A1 | 9/2005 | Shimizu et al. | |

(Continued)

FOREIGN PATENT DOCUMENTS
WO 2006052791 5/2006

OTHER PUBLICATIONS

Search Report for Italian Application No. TO20090737, Ministero dello Sviluppo Economico, Sep. 13, 2010, pp. 3.

(Continued)

*Primary Examiner* — Kyoung Lee
(74) *Attorney, Agent, or Firm* — Graybeal Jackson LLP

(57) ABSTRACT

An integrated device includes a semiconductor body, in which an STI insulation structure is formed, which delimits laterally first active areas and at least one second active area, respectively, in a low-voltage region and in a power region of the semiconductor body. The integrated device moreover includes low-voltage CMOS components, accommodated in the first active areas, and a power component in the second active area. The power component has a source region, a body region, a drain-contact region, and at least one field-insulating region, set between the body region and the drain-contact region. The field-insulating region is provided entirely on the semiconductor body.

22 Claims, 9 Drawing Sheets

U.S. PATENT DOCUMENTS

| | | |
|---|---|---|
| 2006/0086992 A1 | 4/2006 | Kang et al. |
| 2006/0138584 A1 | 6/2006 | Ko |
| 2006/0148110 A1 | 7/2006 | Sung |
| 2007/0138551 A1 | 6/2007 | Ko |
| 2008/0006875 A1 | 1/2008 | Ohtsuka et al. |
| 2009/0072308 A1* | 3/2009 | Chen et al. .................... 257/336 |
| 2009/0085109 A1* | 4/2009 | Izumi ............................ 257/334 |
| 2010/0102388 A1 | 4/2010 | Levin et al. |
| 2011/0073960 A1 | 3/2011 | Causio et al. |

OTHER PUBLICATIONS

J. Kim, S. G. Kim, J. G. Koo and D. Y. Kim, "p-channel LDMOS transistor using new tapered field oxidation technology", Electronics Letters, Sep. 17, 1998, vol. 34, No. 19, pp. 2.

Search Report for Italian Application No. TO20090738, Ministero dello Sviluppo Economico, Sep. 10, 2010, pp. 3.

* cited by examiner

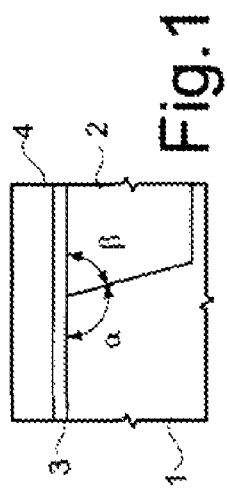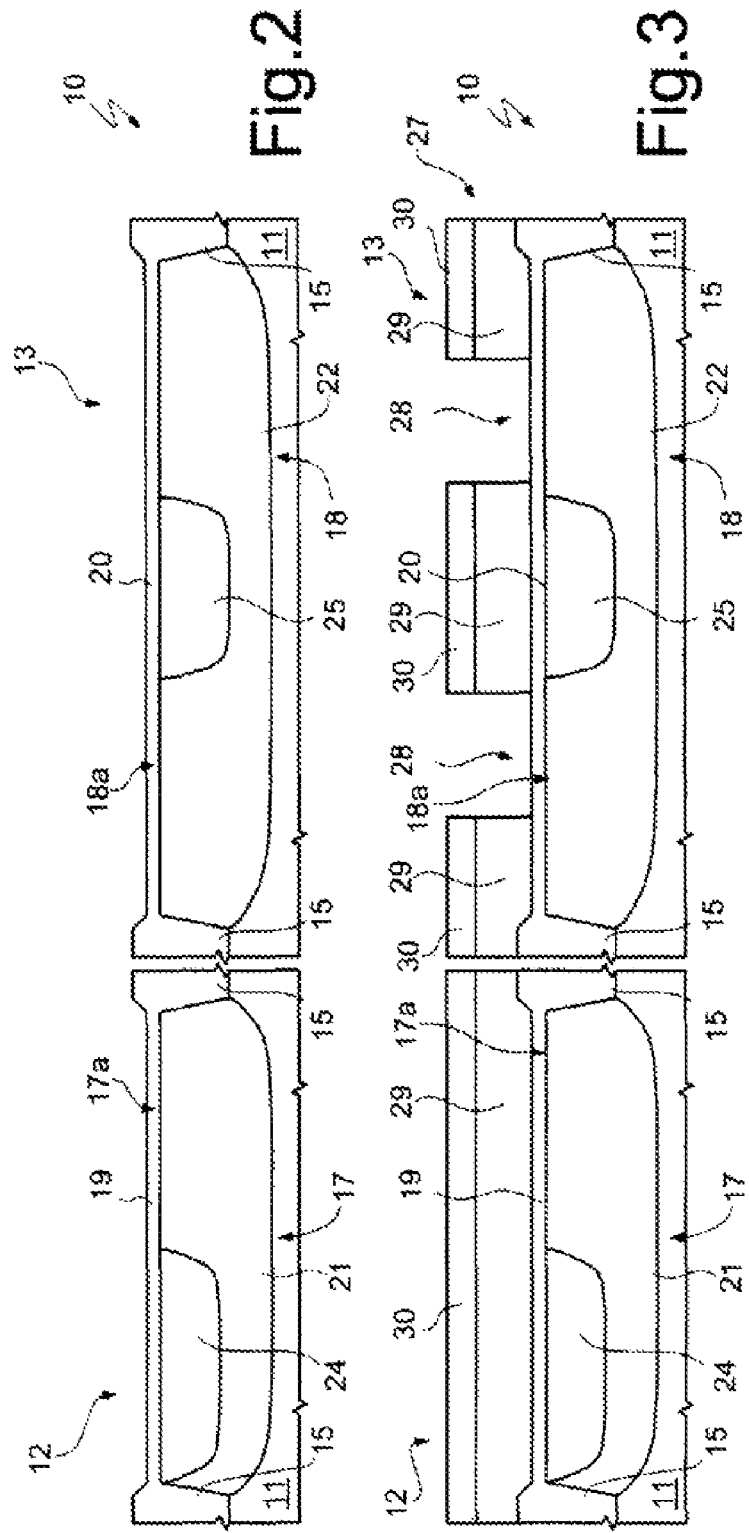

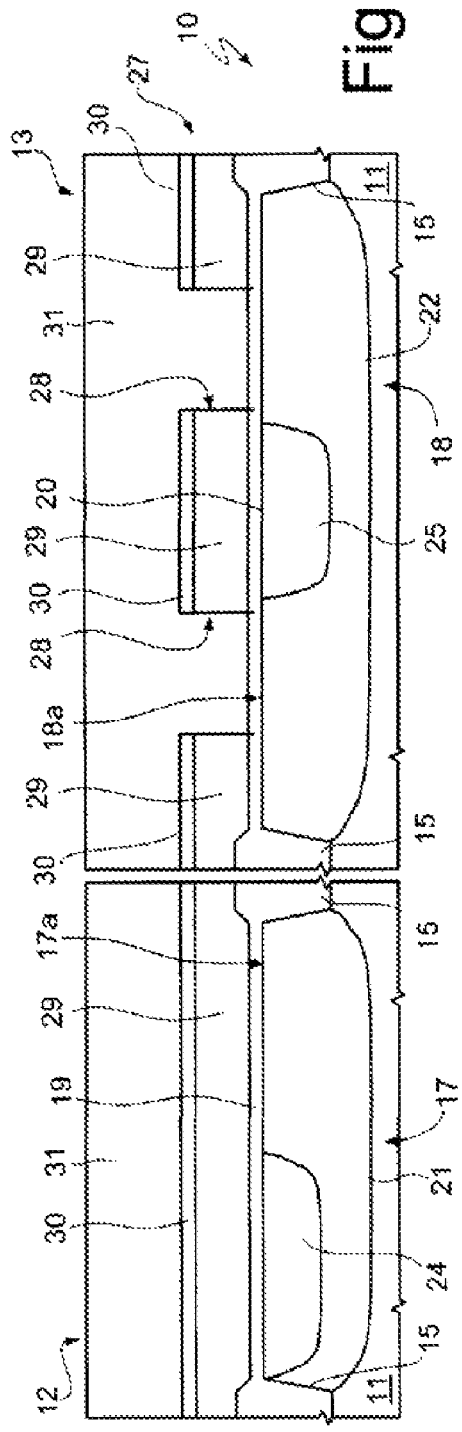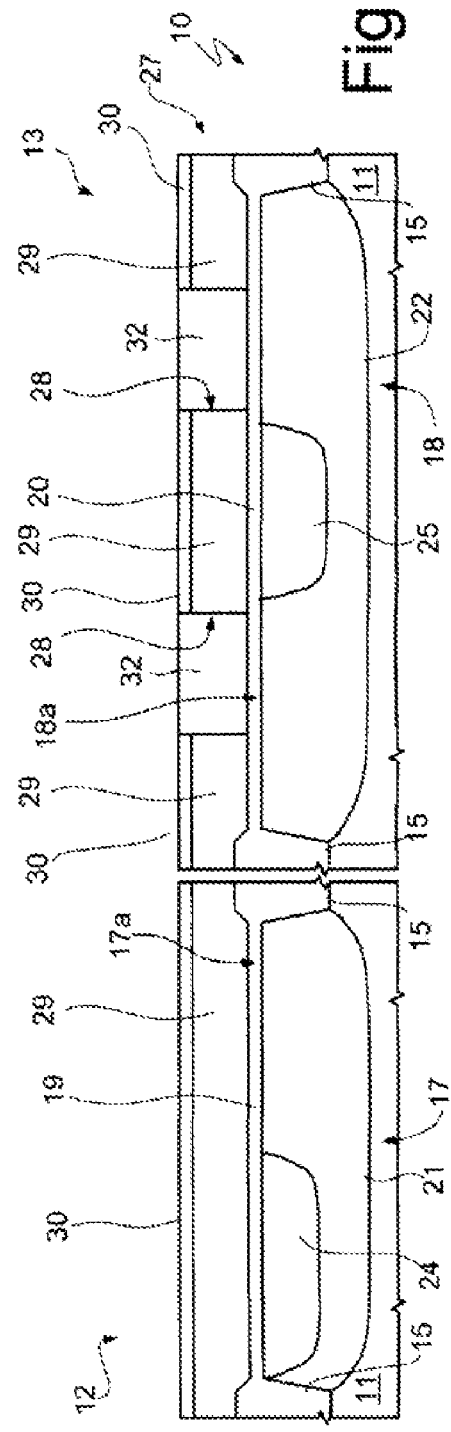

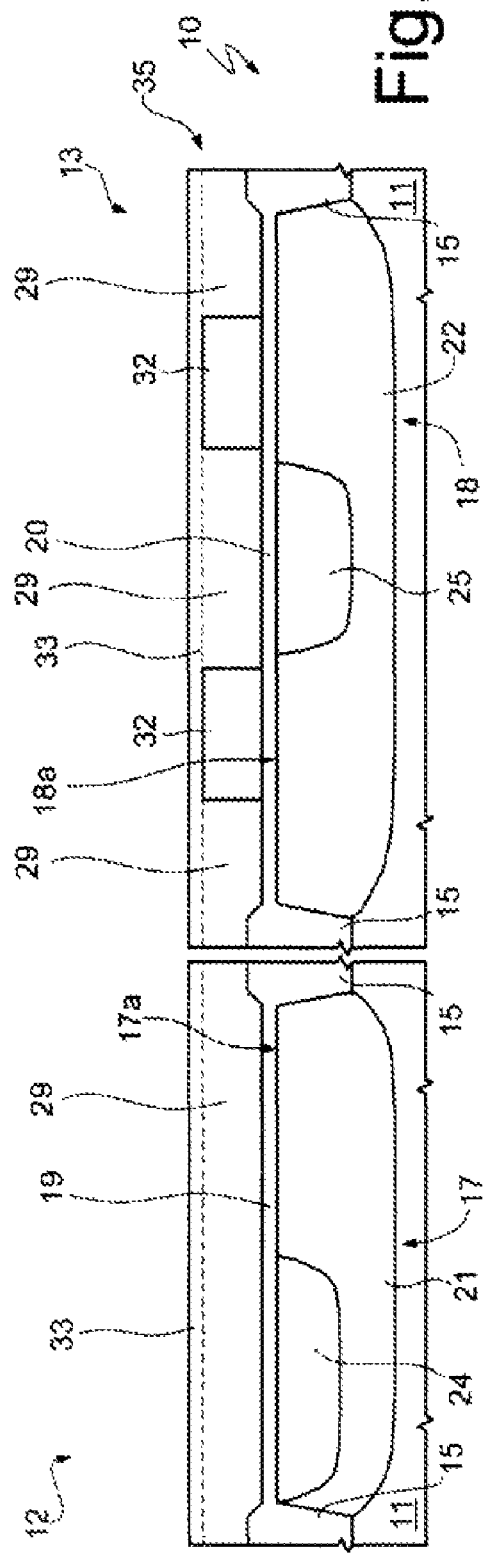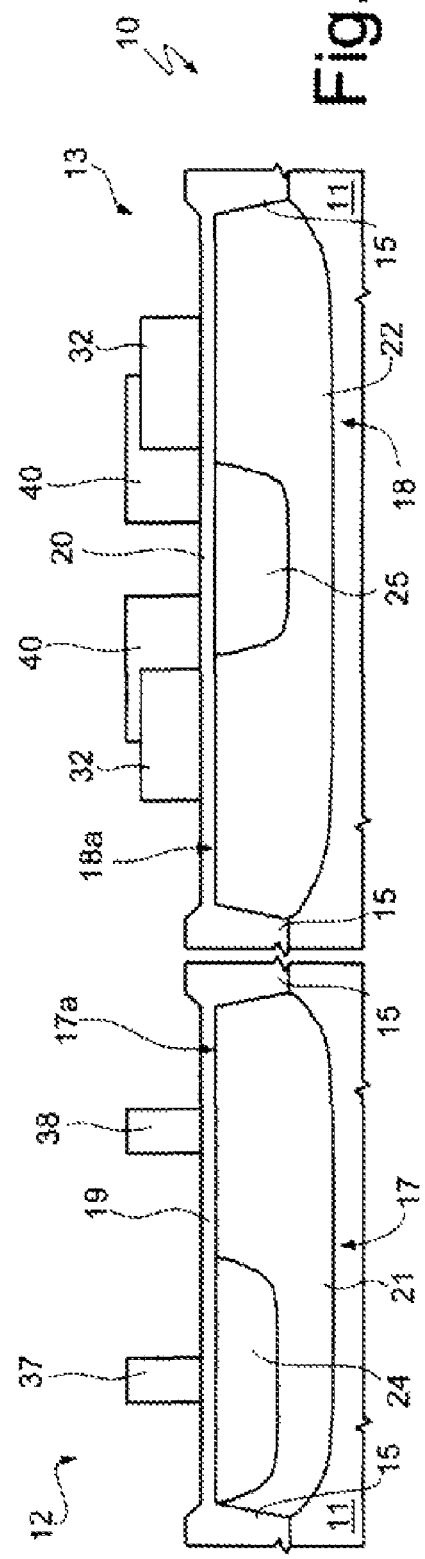

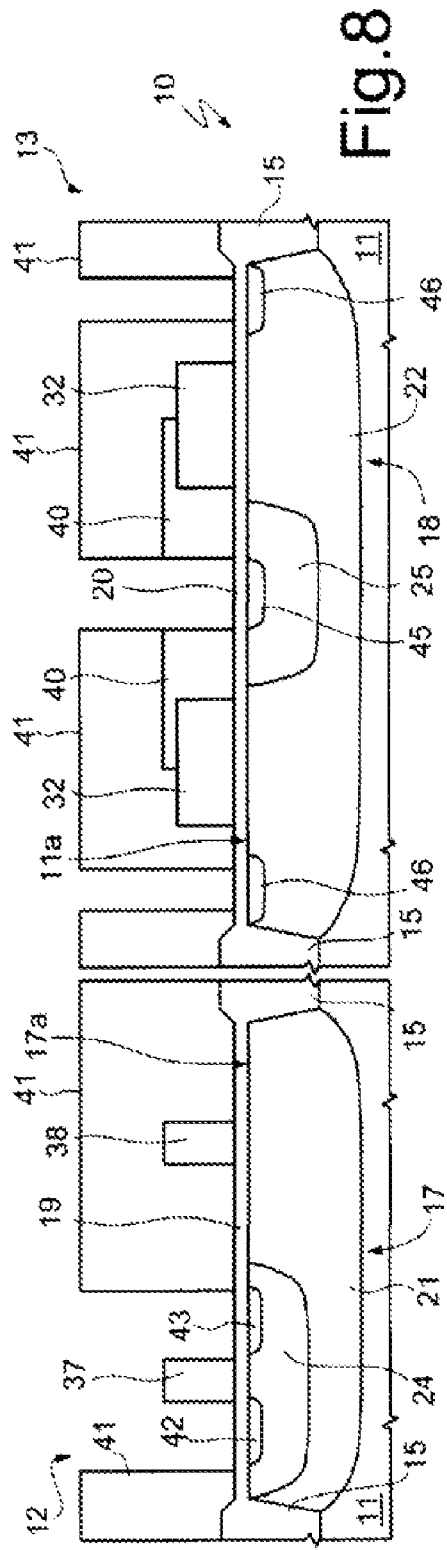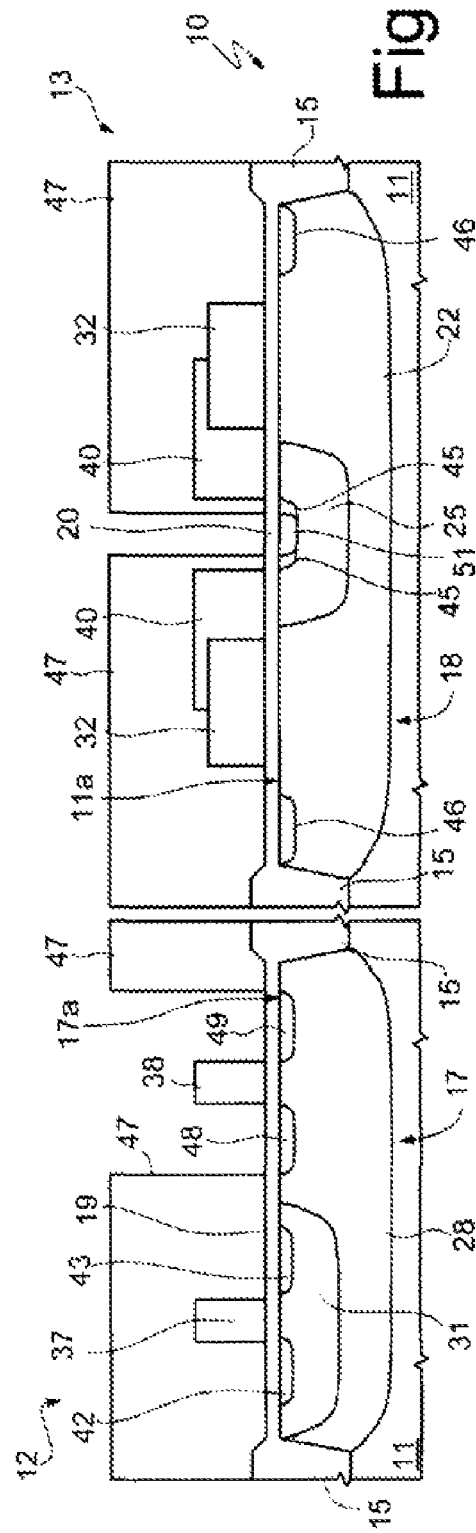

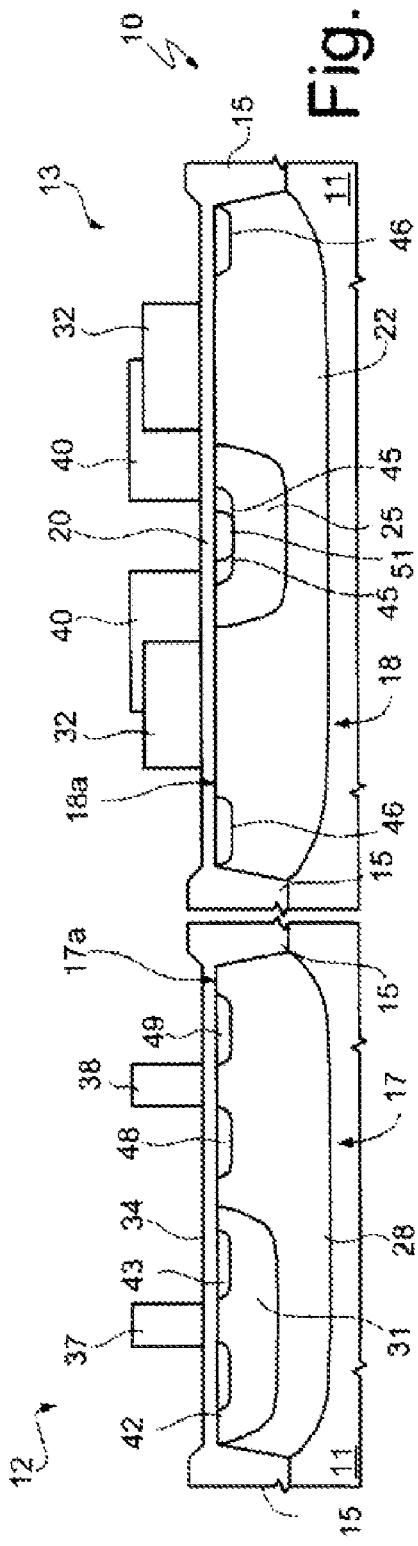
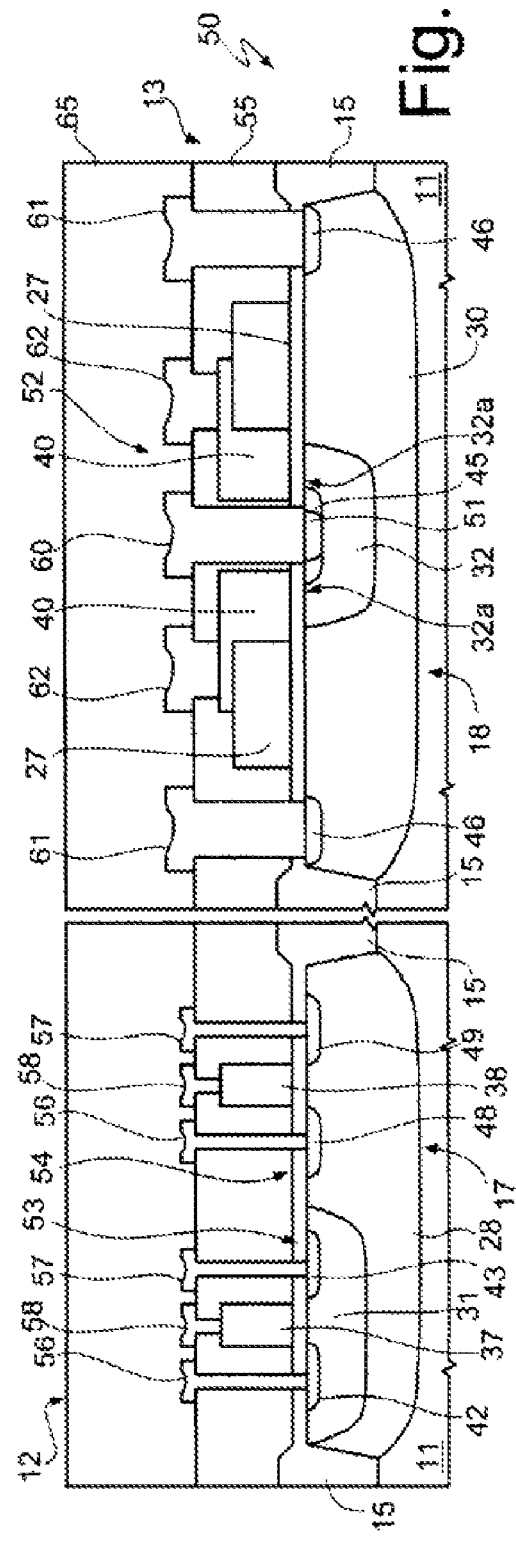

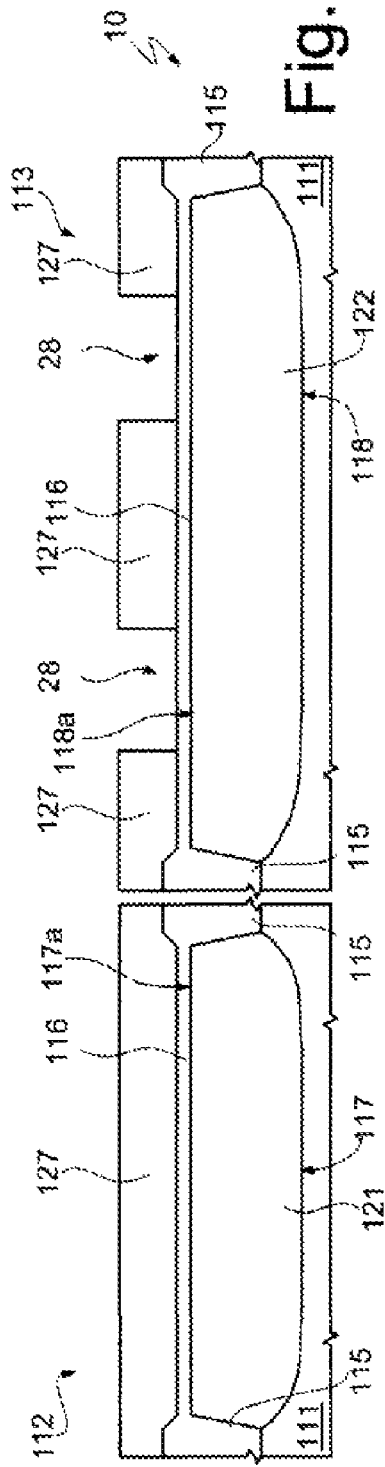
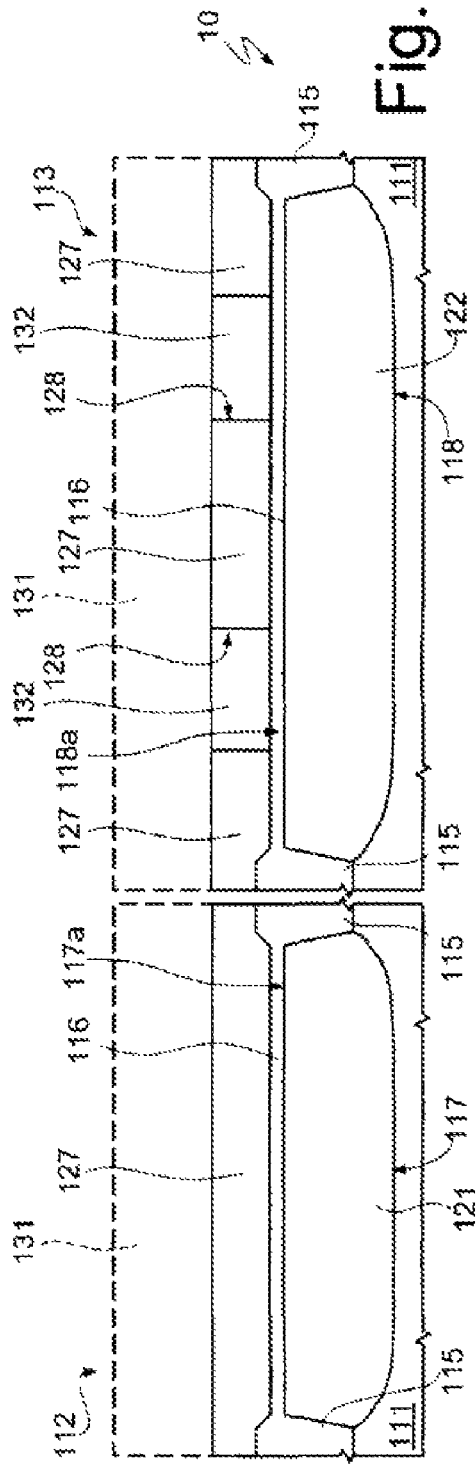

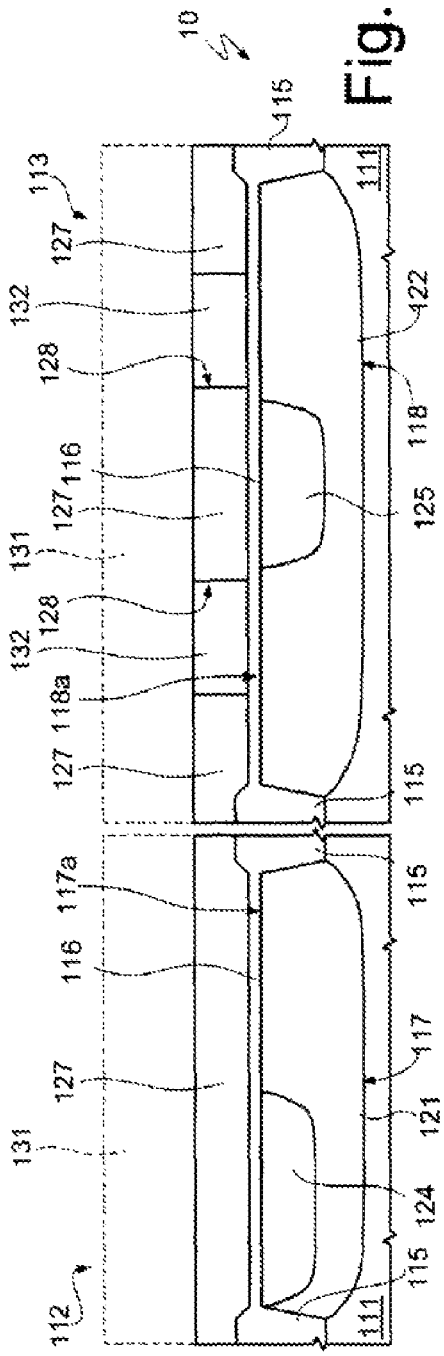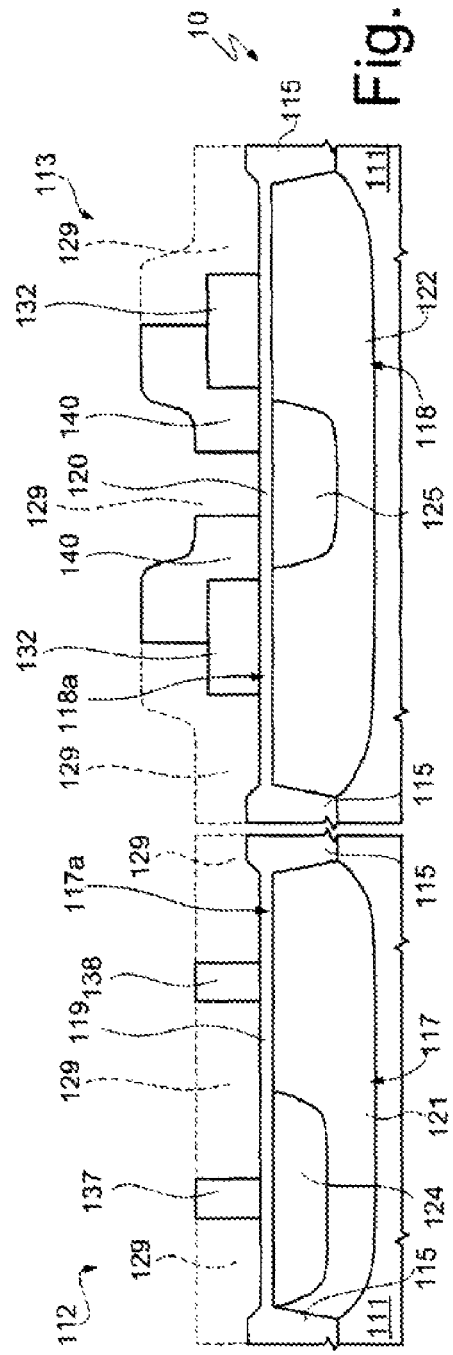

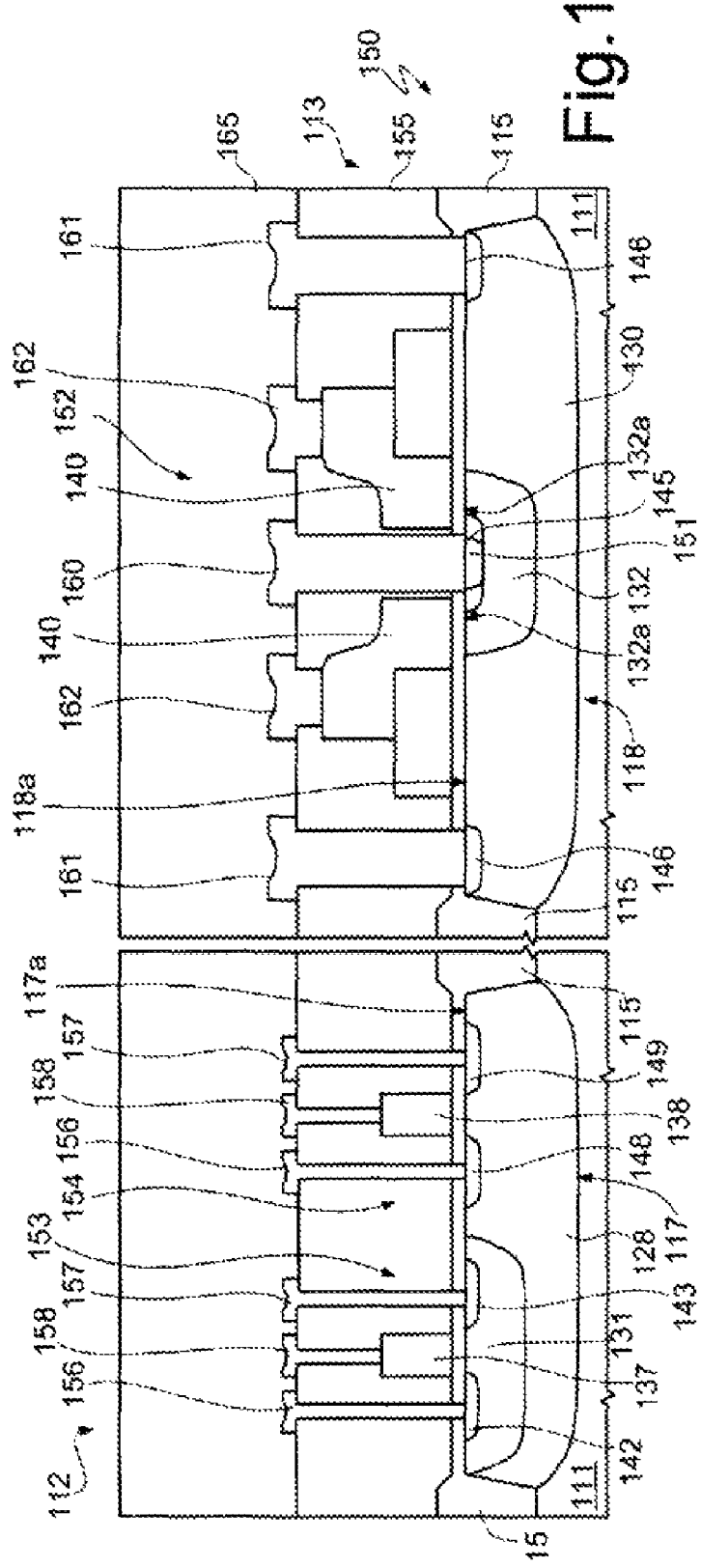

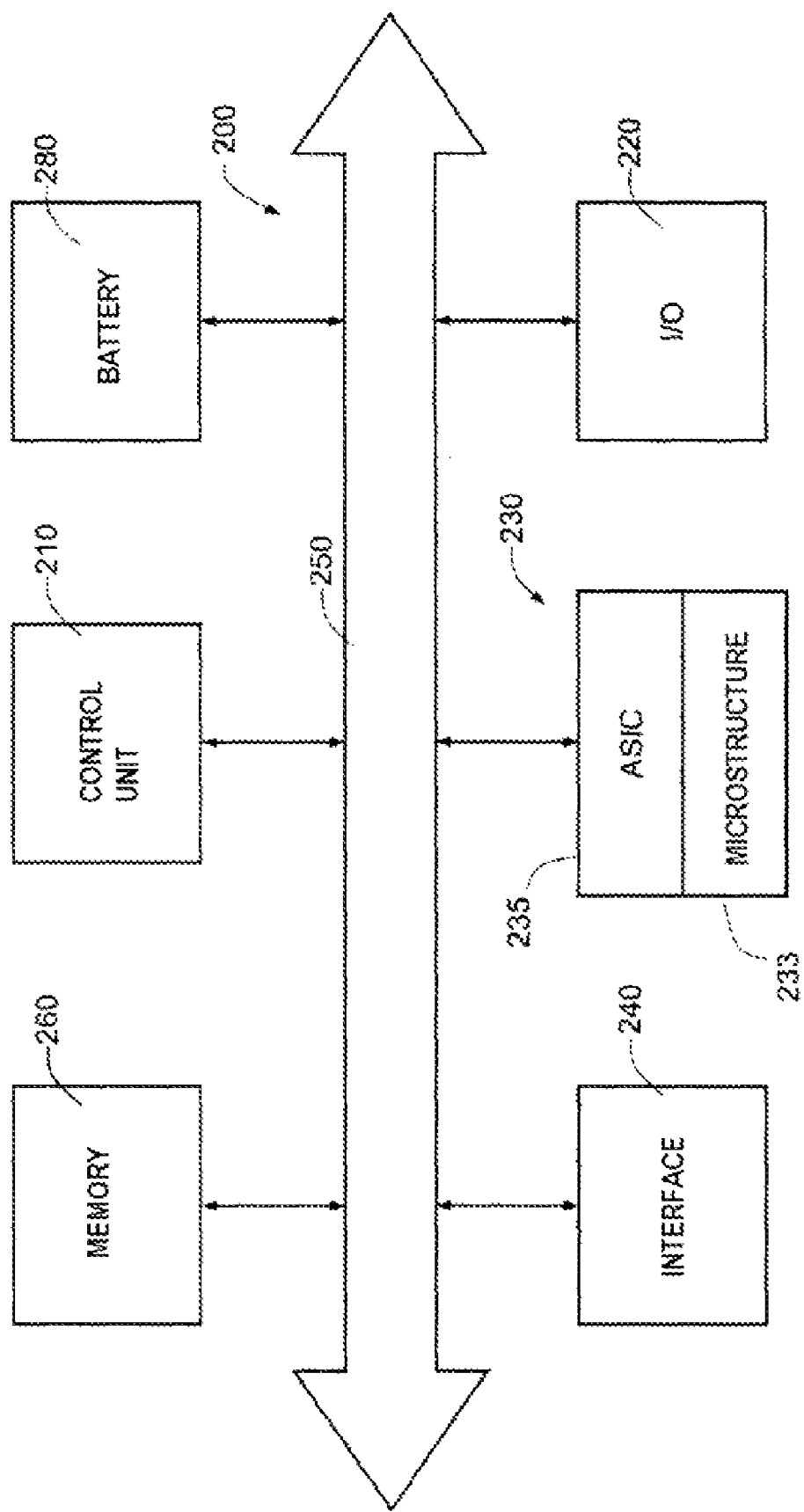

US 8,338,888 B2

PROCESS FOR MANUFACTURING AN INTEGRATED DEVICE WITH "DAMASCENE" FIELD INSULATION, AND INTEGRATED DEVICE MADE BY SUCH PROCESS

PRIORITY CLAIM

The instant application claims priority to Italian Patent Application No. TO2009A000738, filed Sep. 29, 2009, which application is incorporated herein by reference in its entirety.

RELATED APPLICATION DATA

This application is related to U.S. patent application Ser. No. 12/893,269, entitled INTEGRATED DEVICE WITH RAISED LOCOS INSULATION REGIONS AND PROCESS FOR MANUFACTURING SUCH DEVICE filed Sep. 29, 2010, and which is incorporated herein by reference in its entirety.

TECHNICAL FIELD

An embodiment of the present disclosure relates to a process for manufacturing an integrated device with "damascene" field insulation and to an integrated device obtained using said process.

BACKGROUND

As is known, for numerous applications of microelectronics, there has risen the need to integrate in a single semiconductor chip low-voltage devices and power devices (which operate with voltages that range from approximately 15 V up to beyond 1000 V). In particular, it has become increasingly common to manufacture low-voltage devices by CMOS technology in a first portion of the chip, and power devices compatible with the CMOS technology, in a second portion of the same chip. The active areas that accommodate the various devices, both low-voltage devices and power devices, are insulated from one another by shallow-trench-insulation (STI) technique, which enables an extremely high degree of integration to be achieved, with extremely small overall dimensions, and for this reason is typically used in CMOS technology. In practice, the substrate of a semiconductor wafer is selectively etched through a hard mask, for example a multilayer mask of silicon oxide and silicon nitride, and trenches are formed that delimit and separate active areas for low-voltage devices and active areas for power devices. The trenches are oxidized and completely filled with deposited dielectric, normally silicon oxide. The wafer is then planarized and the hard mask is thus removed. The active areas are hence separated from one another by insulating structures with practically vertical walls, which extend into the substrate.

The manufacture of power devices with CMOS technology, in particular in active areas defined by STI insulation, however, may have limits when the scale of integration is pushed beyond a certain threshold. These limits have become manifest with 0.25-μm technology and even more evident with 0.18-μm technology. As already mentioned, the walls of the STI structures are almost vertical (normally inclined at) 80°-90°, precisely to minimize the extension of the areas of transition between thin oxide (gate oxide) and thick oxide and thus reduce the overall dimensions. The corresponding interface in the silicon hence has marked angles, as is shown in FIG. 1, where/designates a substrate of semiconductor material, in which an STI structure 2 has been made. The substrate/ and the STI structure 2 are overlaid by a gate-oxide layer 3 and by a gate region 4 made of polycrystalline silicon. The angle α formed between the faces of the substrate/respectively contiguous to the STI structure 2 and to the gate-oxide layer 3, is 180°-β, where β is the slope of the walls of the STI structure 2. The angle α is thus approximately 90°-100° and may cause a significant concentration of the electrical-field lines, in particular in the proximity of the region where the channel of the power device is formed. The concentration of the electrical-field lines may have an adverse effect both on the active-state resistance ($R_{ON}$, which may be high and unstable on account of injection of hot carriers) and on the breakdown voltage (BV) of the power components. In general, there may arise problems of reliability and performance that render incompatible the conventional use of STI to obtain power components integrated with low-voltage CMOS devices.

SUMMARY

An embodiment of the present disclosure is an integrated device and a process for manufacturing said integrated device that enable the limitations described to be overcome.

BRIEF DESCRIPTION OF THE DRAWINGS

For a better understanding of the disclosure, some embodiments will now be described, purely by way of non-limiting example and with reference to the attached drawings, wherein:

FIG. 1 is a cross section through a known integrated device;

FIG. 2 is a cross section through a semiconductor wafer in an initial step of a manufacturing process in accordance with an embodiment of the present disclosure;

FIG. 2 is a cross section through a semiconductor wafer in an initial step of a manufacturing process in accordance with an embodiment of the present disclosure;

FIGS. 3-10 are cross sections through the wafer of FIG. 2 in subsequent processing steps;

FIG. 11 is a cross section through an integrated device in accordance with an embodiment of the present disclosure, obtained from the wafer of FIGS. 2-10;

FIG. 12 is a cross section through a semiconductor wafer in an initial step of a manufacturing process in accordance with a different embodiment of the present disclosure;

FIGS. 13-15 are cross sections through the wafer of FIG. 12 in subsequent processing steps;

FIG. 16 is a cross section through an integrated device in accordance with a further embodiment of the present disclosure, obtained from the wafer of FIGS. 12-15; and FIG. 17 is a simplified block diagram of an electronic system incorporating an integrated device according to an embodiment of the present disclosure.

DETAILED DESCRIPTION

FIG. 2 shows a cross section through an embodiment of a semiconductor wafer, designated as a whole by the reference number 10, which comprises a structural layer, for example a substrate 11 of monocrystalline silicon of a P type. In a different embodiment (not illustrated), the structural layer is an epitaxial layer grown on the substrate 11.

A low-voltage region 12 and a power region 13 are defined in the substrate 11 (which in the annexed figures are not represented in scale, for reasons of simplicity; in particular, the low-voltage region 12 is enlarged). In greater detail, in the substrate 11 there has preliminarily been formed an STI-type insulation structure 15 (shallow-trench insulation), which laterally delimits low-voltage active areas 17 (only one of which is shown in FIG. 2, for reasons of simplicity) in the low-voltage region 12, and a power active area 18 in the power region 13. The low-voltage active areas 17 and the power active area 18 have respective surfaces 17a, 18a, which are planar and coplanar. Here and in what follows, it is understood that the wafer 10 is oriented in such a way that the surfaces 17a, 18a will be horizontal and face upwards, whilst an opposite face of the substrate 11 (not shown) faces downwards. Consequently, the terms that indicate spatial relations between elements are to be interpreted in the light of the references defined above. It is understood of course that both during processing and in use the wafer and the devices present therein and produced therefrom may be oriented in any way.

The low-voltage active areas 17 and the power active area 18 are respectively coated with a low-voltage gate-oxide layer 19 and a power gate-oxide layer 20, which have a differentiated thickness (in particular, the power gate-oxide layer 20 is thicker; however, in the figures for reasons of simplicity the low-voltage gate-oxide layer 19 and the power gate-oxide layer 20 are illustrated with the same thickness).

Before forming the low-voltage gate-oxide layer 19 and the power gate-oxide layer 20, in the substrate 11 there have been made low-voltage N wells 21, in portions of the low-voltage active regions 17 that are to accommodate NMOS-type transistors (only one of which is illustrated in the attached figures for reasons of simplicity), and a power N well 22, in the power active region 18. In addition, low-voltage body wells 24 and a power body well 25 have been formed inside the low-voltage N wells 21 and the power N well 22, respectively.

As shown in FIG. 3, a field mask 27 is then provided, which coats the wafer 10 entirely and has symmetrical openings 28 on the power active area 18, laterally with respect to the power body well 25. The openings 28 extend until they expose respective portions of the power gate-oxide layer 20. In one embodiment, the field mask 27 is obtained by depositing in succession a first polysilicon layer 29 and a silicon-nitride layer 30 (for example, having a thickness, respectively, of approximately between 150 nm and 200 nm and approximately between 30 nm and 100 nm), which are selectively etched to form the openings 28.

Then (FIG. 4), a dielectric layer 31 is deposited, for example silicon oxide, having a thickness sufficient to fill the openings 28 of the field mask 27 completely. The dielectric layer 31 is then densified.

The wafer 10 is planarized with a CMP (chemical mechanical polishing) process, stopped on the silicon-nitride layer 30 (FIG. 5). The CMP process removes the dielectric layer 31 from the top of the wafer 10 and leaves portions thereof only inside the openings 28, where field-insulating regions 32 are formed. Consequently, the field-insulating regions 32 are obtained entirely on the power active area 18, the surface 18a of which remains planar and coplanar to the surface 17a of the low-voltage active areas 17.

The silicon-nitride layer 30 is then selectively etched and removed (FIG. 6), and a second polysilicon layer 33 is deposited, which coats the field-insulating regions 32 and forms a polycrystalline semiconductor structure 35 with the first polysilicon layer 29. The field-insulating regions 32 are hence incorporated in the polycrystalline semiconductor structure 35.

As shown in FIG. 7, the polycrystalline semiconductor structure 35 is shaped so as to form low-voltage gate regions 37, 38 and power gate regions 40. The low-voltage gate regions 37, 38 are formed on the low-voltage active areas 17, where it is envisaged to provide low-voltage CMOS components. In addition, the low-voltage gate regions 37 are made above respective low-voltage body wells 24. The power gate regions 40 in part cover respective field-insulating regions 32 and extend towards one another on the power gate-oxide layer 20 and on the power body well 25, without, however, connecting to one another. The portions of the power gate regions 40 that lie on the power gate-oxide layer 20 have a thickness substantially equal to the thickness of the polycrystalline semiconductor structure 35, whereas the portions that extend over the respective field-insulating regions 32 have a thickness substantially equal to the thickness of the second polysilicon layer 33 alone.

An N+ implant and a P+ implant are then performed.

For the implantation of a N-type dopant species (N+ implant, FIG. 8), a first implantation mask 41 is used, which exposes portions of the low-voltage body wells 24, at the sides of the low-voltage gate regions 37 (in effect, it is the low-voltage gate-oxide layer 19 that is exposed, which, however, is traversed by the implanted species; hence, for reasons of simplicity, reference will be made in what follows to the underlying regions as exposed regions, neglecting the presence of the gate-oxide layers 19, 20 as far as the implantation steps are concerned). In the power region 13, the first implantation mask 41 exposes also part of the power body well 25, between the power gate regions 40, and the power active area 18, at the sides of the field-insulating regions 32. In the low-voltage body wells 24 low-voltage source regions 42 and low-voltage drain regions 43 are thus obtained. In the power region 13, a power source region 45 is formed in the power body well 32, and drain-contact regions 46 are formed in the power active area 18, alongside the field-insulating regions 32.

With reference to FIG. 9, for the implantation of a P-type dopant species (P+ implant) a second implantation mask 47 is used, which protects the low-voltage body wells 26 and the power region 13, except for a central portion of the power source region 45, and exposes portions of the substrate 11 in the low-voltage active areas 17 around the low-voltage gate regions 37. Low-voltage source regions 48 and low-voltage drain regions 49 are thus obtained in the low-voltage region 12. In the power region 13, instead, a source-contact region 51 is formed, which traverses the power source region 45 and reaches the power body well 25.

Once the second implantation mask 47 has been removed, the implanted dopants are thermally diffused (FIG. 10). In this step, in particular, the power source region 45 diffuses underneath the power gate regions 40.

The power gate-oxide layer 20 insulates the power gate region 40 from the power N well 30, from a channel region 32a (defined in the power body well 32 at the interface with the power gate-oxide layer 35), and from the power source region 45.

The process is then terminated by contact and protection steps to obtain an integrated device 50 (shown in FIG. 11), which comprises a power component 52 (in particular a lateral NMOS transistor) in the power region 13 and low-voltage CMOS components (NMOS transistors 53 and PMOS transistors 54) in the low-voltage region 12.

A first insulating layer 55, for example silicon oxide, is deposited over the entire wafer 10. Then, a selective etch is performed for opening contact windows in the low-voltage region 12, on the low-voltage source regions 42, 48 and on the low-voltage drain regions 43, 49. In the power region 13, instead, contact windows (not shown either) are opened on the source-contact region 51, on the power gate regions 40, and on the drain-contact regions 46. Then, a metallization layer is deposited and shaped so as to form, in the low-voltage region 12, low-voltage source contacts 56, low-voltage drain contacts 57 and low-voltage gate contacts 58. In the power region 13, instead, there are formed a power source contact 60, power drain contacts 61 on the drain-contact regions 46, and power gate contacts 62 on the portions of the power gate regions 40 that lie on the field-insulating regions 32. After forming a second metallization layer (not shown for reasons of simplicity), the wafer 10 is coated with a second protective insulating layer 65 and is cut into dice, each of which incorporates an example of the integrated device 50 shown in FIG. 11.

In one alternative embodiment (not illustrated), further metallization layers and insulating layers are provided prior to the protective layer and dicing of the wafer.

As already mentioned, the integrated device 50 comprises low-voltage CMOS components (NMOS transistors 53 and PMOS transistors 54), in the low-voltage region 12 and at least one power component 52 (lateral NMOS transistor) in the power region 13. The low-voltage CMOS components 53, 54 are obtained in the low-voltage active areas 17. Given that the voltages involved in this region are modest, the characteristic STI angles may not pose limitations to proper operation of the CMOS components.

In the power region 13, instead, the voltages and the electrical field are much higher. However, due to the use of a damascene-type technique to obtain field insulation, the surface 18a of the substrate 11 in the power active area 18 may be planar and, therefore, may not present corners or sharp edges. Consequently, the distribution of the electrical field may be more homogeneous, and concentrations of field lines that would otherwise limit the performance of the device in terms both of active-state resistance ($R_{ON}$) and of breakdown voltage (BV) may be prevented. In addition, the paths length for the charges from the source region to the drain region may be reduced owing to the absence of buried-field oxide, typical of STI insulation, and this may enable reduction of the active-state resistance $R_{ON}$ given the same area of silicon occupied. The power components may be hence more reliable and efficient.

In addition, control of the lateral extension of the field-insulating regions may be very precise thanks to the use of a damascene-type technique, where a mask is filled by deposition of material, and a step of planarization removes the material that exceeds the openings of the mask. Also the lateral dimensions may be reduced thanks to the accurate dimensional control.

An embodiment of the integrated device described and the corresponding manufacturing process may thus allow one to exploit advantages of the STI-type insulation, especially as regards the reduction of the area occupied, without, however, incurring the limitations set by the accentuated angles, typical of STI insulation, in the production of power components.

According to a variant (not illustrated) of the process, the body implantation may be performed after formation of the field-insulating regions and the polycrystalline semiconductor structure. In this case, the polycrystalline semiconductor structure may be shaped in two steps. In a first step, only a portion of the polycrystalline semiconductor structure that is located between the field-insulating regions is etched and removed. Then, after the body implantation has been performed, the polycrystalline semiconductor structure is again etched and the power gate regions are defined.

Another embodiment of the disclosure is shown in FIGS. 12-16.

A semiconductor wafer 100 (FIG. 12) comprises a substrate 111, in which an STI-type insulation structure 115 has preliminarily been made, which defines a low-voltage region 112 and a power region 113 and laterally delimits low-voltage active areas 117 in the low-voltage region 112 and a power active area 118 in the power region 113. The low-voltage active areas 117 and the power active area 118 have respective planar and coplanar surfaces 117a, 118a and are coated with a sacrificial-oxide layer 116 (for example, of between 10 and 80 nm).

Moreover, low-voltage N wells 121 in the wafer 100 in the low-voltage active regions 117 and a power N well 122 in the power active region 118 have preliminarily been made. In an alternative embodiment, the N wells are formed in a subsequent step of the process, in particular just prior to replacement of the pad oxide with gate-oxide layers.

A field mask 127 is formed on the wafer 100, directly on the sacrificial-oxide layer 116 by depositing and subsequently shaping a silicon-nitride layer. The hard mask 127 has symmetrical openings 128 on the power active area 118.

Then (FIG. 13), a dielectric layer 131 (indicated with a dashed line in FIG. 13) is deposited, which fills the openings 128 of the field mask 127 completely, and the wafer 100 is planarized with a CMP process, stopped on the field mask 127. The CMP process removes the dielectric layer 131 from above the wafer 100 and leaves portions thereof only inside the openings 128, where field-insulating regions 132 are formed, which are hence obtained entirely on the substrate 111.

The field mask 127 and the sacrificial-oxide layer 116 are then removed, as shown in FIGS. 14 and 15, and a low-voltage gate-oxide layer 119 and a power gate-oxide layer 120 are grown. Then, a body implantation is performed to obtain low-voltage body wells 124 and a power body well 125.

A polysilicon layer 129 (indicated with a dashed line in FIG. 15), englobing the field-insulating regions, is deposited and shaped to form low-voltage gate regions 137, 138 in the low-voltage region 112 and power gate regions 140 that extend in part over the power body well 125 and in part over the field-insulating regions 132.

The process then goes on as already described previously.

In particular (FIG. 15), N+ and P+ implants are performed (the masks are similar to the implantation masks 41, 47 shown in FIGS. 8 and 9 and are not illustrated here for reasons of simplicity). By the N+ implant, low-voltage source regions 142 and low-voltage drain regions 143 are obtained in the low-voltage region 112, and a power source region 145 is obtained in the power region 113, inside the power body well 125. In addition, drain-contact regions 146 are formed in the power active area 118, alongside the STI-type insulation structure 115. The P+ implant is carried out to obtain low-voltage source regions 148 and low-voltage drain regions 149 in the low-voltage region 112. In the power region 113, instead, a source-contact region 151 is made, which traverses the power source region 145 and reaches the power body well 125.

The process is terminated by contact and protection steps, to obtain an integrated device 150 (shown in FIG. 16), which comprises a power component 152 (in particular a lateral NMOS transistor) in the power region 113 and low-voltage CMOS components (NMOS transistors 153 and PMOS transistors 154) in the low-voltage region 112.

In particular, after deposition and selective etching of a first insulating layer 155, low-voltage source contacts 56, low-voltage drain contacts 157, and low-voltage gate contacts 158 are obtained from a metallization layer (not shown entirely) in the low-voltage region 112.

In the power region 113, instead, there are made a power source contact 60, power drain contacts 161 on the drain-contact regions 146, and power gate contacts 162 on the portions of the power gate regions 140 that lie on the field-insulating regions 132.

After forming a second metallization layer (not shown for reasons of simplicity), the wafer 100 is coated with a second protective insulating layer 165 and is cut into dice, each of which incorporates an example of the integrated device 150 shown in FIG. 16.

The integrated device described may be advantageously used to obtain the control circuitry of devices incorporated in complex systems. Non-limiting examples of use of integrated devices of the type described are found in the control of actuators, in particular based upon electric motors (such as in the automotive sector, or in the sector of actuators for printers), or else in the control of microelectromechanical systems (MEMS).

In FIG. 17 a portion of a system 200 in accordance with one embodiment of the present disclosure is illustrated. The system 200 may comprise a controller 210, an input/output (I/O) device 220 (for example a keyboard or a display), a microelectromechanical device 230, a wireless interface 240, and a memory 260 of a volatile or nonvolatile type, coupled to one another through a bus 250. In one embodiment, a battery 280 may be used for supplying the system 200. Other embodiments may have more or fewer than all of the devices listed.

The microelectromechanical device 230 comprises a microstructure 233 and an integrated device 235 (ASIC, Application-Specific Integrated Circuit) dedicated to driving and control of the reading microstructure 233 and, possibly, to detection of quantities that may be measured by the microstructure 233. The integrated device 235 comprises low-voltage CMOS components and power components integrated in one and the same semiconductor chip and is made according to an embodiment of what is described with reference to FIGS. 1-11 or, alternatively, according to an embodiment of what is described with reference to FIGS. 12-16. In an embodiment, the microelectromechanical device 230 is a microelectromechanical sensor, such as for example an accelerometer, a gyroscope, a pressure sensor, or a microphone. In a different embodiment, the microelectromechanical device 230 is a microactuator.

The controller 210 may comprise, for example, one or more microprocessors, microcontrollers and the like.

The I/O device 220 may be used for generating a message. The system 200 may use the wireless interface 240 for transmitting and receiving messages to and from a wireless communications network with a radiofrequency (RF) signal. Examples of wireless interface may comprise, but are not limited to, an antenna, a wireless transceiver, such as a dipole antenna. In addition, the I/O device 220 may supply a voltage representing what is stored either in the form of digital output (if digital information has been stored) or in the form of analog output (if analog information has been stored).

The system 200 may be used in apparatuses such as, for example, a palm computer (e.g., personal digital assistant, PDA), a laptop or portable computer, possibly with wireless capacity, a cellphone, a messaging device, a digital music player, a digital camera, or other devices.

Finally, it is clear that modifications and variations may be made to the process and to the device described, without departing from the scope of the disclosure.

In the first place, the power component incorporated in the integrated device may have a different arrangement of the drain-contact and gate regions with respect to the source and body regions. In particular, the power component may not be symmetrical, but have only one drain-contact region and only one gate region set on one side of the body well in which the source region is embedded.

The integrated device may moreover comprise an arbitrary number of STI insulating regions coupled to one another or separate from one another. Likewise, the integrated device may comprise an arbitrary number of active areas and of power components.

The implantations of N or P type to obtain the body, source, and drain-contact regions may be performed prior to formation of the STI wells.

Of course, it may be possible to provide devices in which the conductivity of the different regions of semiconductor material is opposite to what has been described.

Furthermore, other devices such as a bipolar transistor, vertical MOS transistor, or silicon-controlled rectifier may include a field-insulating region such as the region 27 of FIG. 11 or region 132 of FIG. 15.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A semiconductor device, comprising:
a drain region;
a body region disposed in the drain region;
a source region disposed in the body region;
a gate insulator disposed over the body region;
a gate region disposed over the gate insulator; and
a first isolation region disposed over the drain region and disposed over the gate insulator.

2. The semiconductor device of claim 1 wherein:
the gate insulator is disposed over the drain region; and
the isolation region is disposed over the gate insulator.

3. The semiconductor device of claim 1 wherein the gate region is in contact with the isolation region.

4. The semiconductor device of claim 1 wherein the gate region is disposed over the isolation region.

5. The semiconductor device of claim 1 wherein the gate region is laterally adjacent to the isolation region.

6. The semiconductor device of claim 1, further comprising:
a semiconductor layer;
wherein the drain region is disposed in the semiconductor layer; and
a second isolation region disposed in the semiconductor layer and laterally adjacent to the drain region.

7. The semiconductor device of claim 1, further comprising:
a semiconductor layer;
wherein the drain region is disposed in the semiconductor layer; and
a silicon-trench isolation region disposed in the semiconductor layer and laterally adjacent to the drain region.

8. The semiconductor device of claim 1 wherein:
the drain region has an N-type conductivity;
the body region has a P-type conductivity; and
the source region has an N-type conductivity.

9. A semiconductor device, comprising:
a drain region;
a body region disposed in the drain region;
a source region disposed in the body region;
a gate insulator disposed over the body region;
a gate region disposed over the gate insulator; and
a first isolation region disposed over the drain region;
further comprising a contact region disposed in the source region.

10. The semiconductor device of claim 9, wherein the contact region disposed in the source region extends to the body region.

11. A semiconductor device, comprising:
a drain region;
a body region disposed in the drain region;
a source region disposed in the body region;
a gate insulator disposed over the body region;
a gate region disposed over the gate insulator; and
a first isolation region disposed over the drain region;
further comprising a contact region disposed in the drain region.

12. A semiconductor device, comprising:
a drain region;
a body region disposed in the drain region;
a source region disposed in the body region;
a gate insulator disposed over the body region;
a gate region disposed over the gate insulator; and
a first isolation region disposed over the drain region;
wherein:
the drain region has a P-type conductivity;
the body region has an N-type conductivity; and
the source region has a P-type conductivity.

13. An integrated circuit, comprising:
a semiconductor layer;
a first drain region disposed in the layer;
a first body region disposed in the drain region;
a first source region disposed in the body region;
a first gate insulator disposed over the body region;
a first gate region disposed over the gate insulator; and
a first isolation region disposed over the drain region and over the gate insulator.

14. The integrated circuit of claim 13, further comprising a second isolation region disposed in the semiconductor layer and laterally adjacent to the drain region.

15. An integrated circuit, comprising:
a semiconductor layer;
a first drain region disposed in the layer;
a first body region disposed in the drain region;
a first source region disposed in the body region;
a first gate insulator disposed over the body region;
a first gate region disposed over the gate insulator; and
a first isolation region disposed over the drain region;
further comprising:
a second body region disposed in the layer;
a second drain region disposed in the second body region;
a second source region disposed in the second body region;
a second gate insulator disposed over the second body region;
a second gate region disposed over the second gate insulator; and
a second isolation region disposed in the semiconductor layer between the first drain region and the second body region.

16. A system, comprising:
a first integrated circuit including a device that includes:
a first drain region;
a first body region disposed in the drain region;
a first source region disposed in the body region;
a first gate insulator disposed over the body region;
a first gate region disposed over the gate insulator; and
a first isolation region disposed over and separated from the drain region; and
a second integrated circuit coupled to the first integrated circuit.

17. The system of claim 16 wherein the first and second integrated circuits are disposed on a same die.

18. The system of claim 16 wherein the device comprises a power transistor.

19. The system of claim 16 wherein the device comprises a lateral power transistor.

20. A system, comprising:
a first integrated circuit including a device that includes:
a first drain region;
a first body region disposed in the drain region;
a first source region disposed in the body region;
a first gate insulator disposed over the body region;
a first gate region disposed over the gate insulator; and
a first isolation region disposed over the drain region; and
a second integrated circuit coupled to the first integrated circuit;
wherein the first and second integrated circuits are disposed on respective dies.

21. A system, comprising:
a first integrated circuit including a device that includes:
a first drain region;
a first body region disposed in the drain region;
a first source region disposed in the body region;
a first gate insulator disposed over the body region;
a first gate region disposed over the gate insulator; and
a first isolation region disposed over the drain region; and
a second integrated circuit coupled to the first integrated circuit;
wherein the one of the first and second integrated circuits comprises a controller.

22. A semiconductor device, comprising:
a drain region;
a body region disposed in the drain region;
a source region disposed in the body region;
a gate insulator disposed over the body region;
a gate region disposed over the gate insulator; and
a first isolation region disposed over and separated from the drain region.

* * * * *

UNITED STATES PATENT AND TRADEMARK OFFICE
CERTIFICATE OF CORRECTION

PATENT NO. : 8,338,888 B2
APPLICATION NO. : 12/893219
DATED : December 25, 2012
INVENTOR(S) : Paolo Colpani Page 1 of 1

It is certified that error appears in the above-identified patent and that said Letters Patent is hereby corrected as shown below:

In Claim 21, Column 10, Line 42 of the patent, "wherein the one of the first and second integrated circuit circuits comprises a controller" should read -- wherein the one of the first and second integrated circuits comprises a controller --.

Signed and Sealed this
Fifth Day of March, 2013

Teresa Stanek Rea
*Acting Director of the United States Patent and Trademark Office*